United States Patent [19]

Lee et al.

[11] Patent Number: 5,686,350
[45] Date of Patent: Nov. 11, 1997

[54] METHOD FOR FABRICATING DEFECT-FREE COMPOUND SEMICONDUCTOR THIN FILM ON DIELECTRIC THIN FILM

[75] Inventors: Bun Lee; Mee-Young Yoon; Jong-Hyeob Baek, all of Daejeon, Rep. of Korea

[73] Assignee: Electronics and Telecommunications Research Institute, Daejeon, Rep. of Korea

[21] Appl. No.: 350,022

[22] Filed: Nov. 29, 1994

[30] Foreign Application Priority Data

Nov. 15, 1994 [KR] Rep. of Korea ............ 94-29924

[51] Int. Cl.⁶ ............................................. H01L 21/20
[52] U.S. Cl. ................... 437/126; 437/146; 437/959; 437/962
[58] Field of Search ............................ 437/146, 959, 437/962, 126

[56] References Cited

U.S. PATENT DOCUMENTS 5,116,455  5/1992  Daly ............................. 117/93
5,321,302  6/1994  Shimawaki ..................... 257/591

OTHER PUBLICATIONS

"Properties and Use of $In_{0.5}(Al_xGa_{1-x})_{0.5}P$ and $Al_xGa_{1-x}As$ Native Oxides in Heterostructure Lasers" by Kish et al in Jr. of Electronic Materials vol. 29 (12) 1992, pp. 1133–1139.

*Primary Examiner*—Robert Kunemund
*Attorney, Agent, or Firm*—Antonelli, Terry, Stout & Kraus, LLP.

[57] ABSTRACT

A method for fabricating a defect-free compound semiconductor thin film on a dielectric thin film which oxidizes multi-semiconductor layers consisting of a hetero compound semiconductor thin film made of one of GaAs, InGaAs or InAs over a thin film containing a carbon impurity of a high concentration and made of AlGaAs series by an annealing at a vapor ambient, thereby rapidly growing a hetero-semiconductor thin film over a dielectric thin film made of $Al_2O_3$ with no defect.

8 Claims, 1 Drawing Sheet

METHOD FOR FABRICATING DEFECT-FREE COMPOUND SEMICONDUCTOR THIN FILM ON DIELECTRIC THIN FILM

BACKGROUND OF THE INVENTION

1. Field of the Invention

The present invention relates to a method for fabricating a compound semiconductor film having a defect-free semiconductor lattice structure on a dielectric thin film.

2. Description of the Prior Art

The prior method for growing a semiconductor thin film over an oxide anneals a surface of an AlAs-AlGaAs-GaAs thin film of a high purity under conditions that the AlAs-AlGaAs-GaAs is directly in contact with a vapor during 3 hours so as to form the oxide.

However, it has the disadvantages that the AlAs-AlGaAs-GaAs has low usage because an oxide speed of a AlAs thin film of a high purity during 3 hours is very slow. The GaAs thin film is oxidized together due to an annealing and thereby changes in quality.

SUMMARY OF THE INVENTION

Accordingly, the present invention solves the above problems and it has an object to provide a method for fabricating a compound semiconductor thin film which is capable of growing a defect-free GaAs epitaxial film on a dielectric thin film and growing various semiconductor thin films on an oxide.

Other objects and features of the present invention can be achieved by providing a method for fabricating a defect-free compound semiconductor thin film on a dielectric thin film which oxidizes multi semiconductor layers consisting of a hetero-compound semiconductor thin film made of one of GaAs, InGaAs or InAs over a thin film containing carbon impurities of a high concentration and made of AlGaAs series by an annealing at a vapor ambient.

In general, when the invention is used to grow various semiconductor thin films on an oxide layer, it has advantages as follows:

First, the invention can freely control a band gap, improve various characteristics of a device and extend the range of a device.

Second, with the invention the device grown over a natural oxide is convenient to process due to an oxide.

Third, the invention can grow thin films such as InGaAs and InAs without defects on a GaAs substrate and form a dielectric thin film between the thin films and the substrate, thereby causing compound semiconductors of a new type such as a semiconductor on insulator (SOI) and a metal oxide semiconductor field effect transistor (MOSFET) to be developed.

Fourth, a device having a 3-dimensional current blocking layer with a new-type distributed Bragg reflector including an oxide can be fabricated by an oxide pattern has an advantage as etching method through a regrowth.

BRIEF DESCRIPTION OF THE DRAWINGS

FIGS. 1a and 1b are diagrams illustrating a method for fabricating a defect-free compound semiconductor thin film on a dielectric thin film in accordance with the present invention, wherein:

FIG. 1A is a sectional view of a configuration of multi-thin film layers after an epitaxy growth process; and FIG. 1B is a sectional view of a configuration of a multi-thin film layer after an oxidation process.

DETAILED DESCRIPTION OF THE INVENTION

Figure 1A:
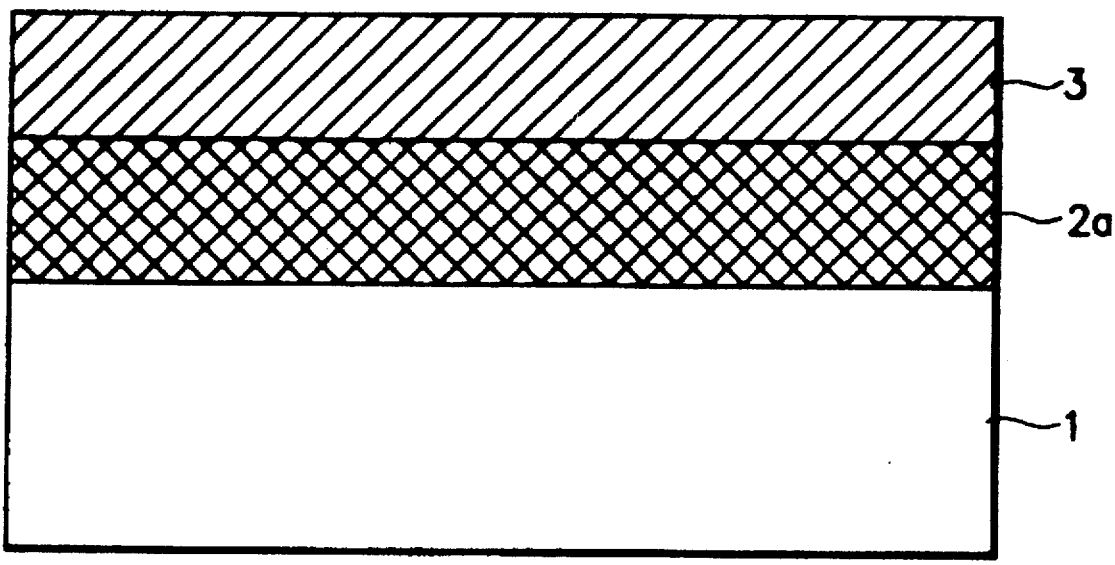
Figure 1B:
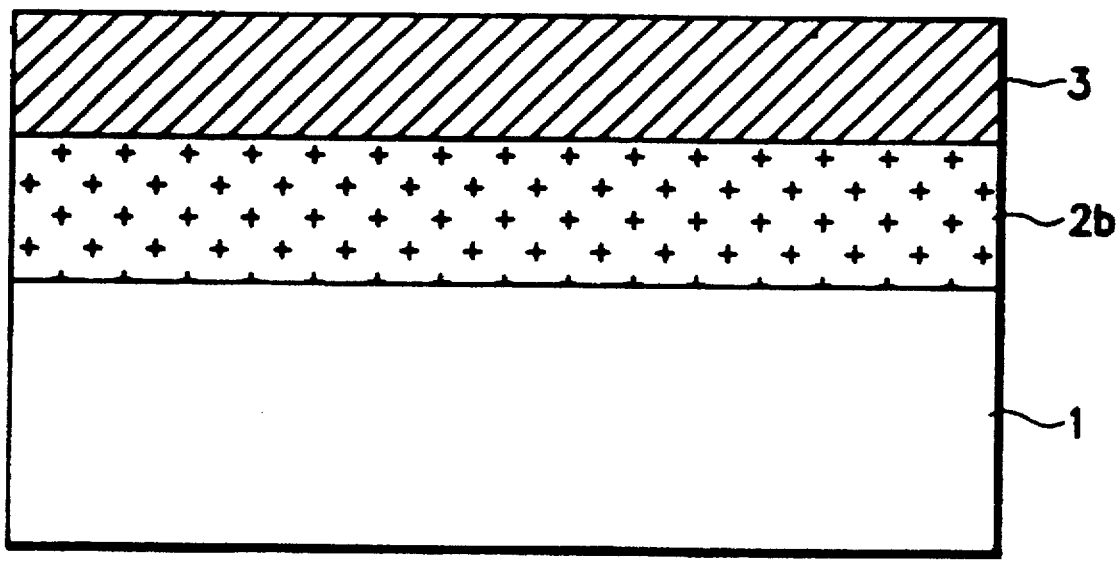

Referring to FIGS. 1A and 1B, there are shown sectional views, respectively, illustrating a method for fabricating a defect-free compound semiconductor thin film on a dielectric thin film in accordance with the present invention.

In accordance with this method, over a GaAs substrate, first, $Al_xGa_{1-x}As$ thin film which is highly doped with carbon impurities in a concentration above $2 \times 10^{20}$ $cm^3$, is grown and subsequently a GaAs cap layer having the same lattice constant as the GaAs substrate is grown to a thickness of 20 nm.

FIG. 1A shows a structure of multi-thin film layers in case where al composite x of the $Al_xGa_{1-x}As$ thin film is 1, thus resulting in AlAs.

In FIG. 1A of the drawings, the reference numeral 1 designates a GaAs substrate, 2a designates an AlAs layer containing carbon impurities of a high concentration, and 3 designates a thin GaAs cap layer, respectively.

A InGaAs thin film which has a lattice constant different from the GaAs substrate may be substituted for GaAs as the cap layer 3 and it is grown below a critical thickness.

Next, the grown thin film is mounted in an electric furnace and is subjected to a natural oxidation process by flowing nitrogen gas mixed with a vapor to the electric furnace at a temperature of 400° C. during about 5 minutes.

At this constant, the larger the Al composite x becomes, the faster the oxidation speed becomes.

After the natural oxidation process, the AlAs layer is changed into an amorphous $Al_2O_3$ which is transparent with respect to a visible light.

Because the oxidation speed of the GaAs thin film serving as the substrate and the cap layer is very slow, an oxide formation of the GaAs layer is negligible at the natural oxidation. However, only the surface of the GaAs thin film exposed on the air is slightly oxidized.

FIG. 1B shows a changed thin film structure of FIG. 1A after an oxidation. Referring to FIG 1B, only the AlAs layer 2a is changed into the stable amorphous $Al_2O_3$ layer 2b and two GaAs layers 1 and 3 remain with no oxidation.

In the natural oxidation process, oxygen from water molecules pass through the GaAs layer 3 serving as the cap layer and abruptly react with $C_{AS}$ in the AlAs layer 2a, thereby being substituted for As and then being combined with Al which is connected to the neighbor $C_{AS}$.

After formation of the nuclear site, the oxygens become consistently substituted for the neighbor As, thereby causing the AlAs layer 2a to be oxidized. Therefore, the nuclear sites are identical with an amount of carbon and are uniformly distributed. Therefore, the AlAs layer 2a is rapidly oxidized and the created oxide film made of $Al_2O_3$ is very stable. The material characteristic of the created oxide film is dielectric which is very different from the AlAs layer.

The AlAs layer undoped with carbon impurities has a very slow oxidation speed.

The upper surface of the GaAs cap layer 3 which has a negligibly slow oxidation speed, is exposed to a vapor so that a small number of atomic layers are oxidized but most of the GaAs cap layer 3 maintains its own lattice state.

The oxidized portion of the GaAs cap layer 3 is removed by a reagent and then new GaAs layer is grown as the cap layer to a desired thickness.

Also in the case where an InAs thin film which has further slower oxidation speed than GaAs layer, serves as the cap layer, it is grown on the AlAs layer 2a with an InAs thin film growth method, with only the AlAs being changed into the $Al_2O_3$ in the same manner as the GaAs layer.

Although the lattice mismatching between the AlAs and InAs layers is large, because the InAs thin film layer is formed on the amorphous $Al_2O_3$ layer after the oxidation process, the strain due to the mismatching don't exist in multi-semiconductor thin film layers.

Therefore, after the oxidized portion of the InAs layer is removed by a reagent, although a new InAs layer is grown thickly by an epitaxy growth method, the defect-free lattice layer can be formed.

When an AlAs or AlGaAs thin film containing carbon impurities of a high concentration is annealed at a vapor ambient, the oxidation speed of the thin film is faster by 20 times than the prior AlAs with no carbon impurities. Therefore, although the GaAs layer is grown on the AlAs layer or the AlGaAs layer, only the AlAs layer or the AlGaAs layer is oxidizable.

According to the present invention, a defect free GaAs thin film layer as well as a defect free InGaAs layer of a hetero junction thin film having a large lattice mismatching with the GaAs layer can be grown on an $Al_2O_3$ layer of a dielectric material.

The method for growing various compound semiconductor thin films on a dielectric thin film can overcome the restrictions of the present band gap technology and contribute to device creation of a new type.

As the discovery of the natural oxide formation technology has contributed to the development of silicon technology, the oxide formation technology of compound semiconductor may pave the way for the development of new compound semiconductor technology.

Although the preferred embodiments of the invention have been disclosed for illustrative purposes, those skilled in the art will appreciate that various modifications, additions and substitutions are possible, without departing from the scope and spirit of the invention as contained in the accompanying claims.

What is claimed is:

1. A method for fabricating a defect-free compound semiconductor thin film on a dielectric thin film comprising the steps:

growing a AlGaAs series thin film doped with carbon impurities of high concentration on a GaAs substrate;

growing a hetero-compound semiconductor cap layer made of one of GaAs, InGaAs and InAs on the AlGaAs series thin film; and annealing the cap layer and the AlGaAs series thin film at a water vapor ambient so that the AlGaAs series thin film is oxidized to be the dielectric thin film with the cap layer functioning as a passage for the water vapor thereby forming a semiconductor on an insulator structure on the GaAs substrate.

2. A method as claimed in claim 1, wherein the water vapor annealing is carried by flowing nitrogen gas mixed with water vapor at the temperature of 400° C. for a period of about 5 minutes to oxidize the AlGaAs series thin film.

3. A method in accordance with claim 1 wherein:
the hetero-compound cap layer is GaAs and only a top portion of the cap layer is oxidized.

4. A method in accordance with claim 2 wherein:
the hetero-compound cap layer is GaAs and only a top portion of the cap layer is oxidized.

5. A method for fabricating a defect-free compound semiconductor thin film on a dielectric film comprising the steps:

growing a AlGaAs series thin film doped with carbon impurities of more than a $1\times10^{18}cm^{13}$ concentration on the GaAs substrate;

growing a hetero-compound semiconductor cap layer made of one of GaAs, InGaAs and InAs on the AlGaAs series thin film; and annealing the cap layer and the AlGaAs series thin film at a water vapor ambient so that the AlGaAs series thin film is oxidized to be the dielectric thin film with the cap layer functioning as a passage for the water vapor thereby forming a semiconductor on an insulator structure on the GaAs substrate.

6. A method as claimed in claim 5, wherein the wet vapor annealing is carried by flowing nitrogen gas mixed with water vapor at the temperature of 400° C. for a period of about 5 minutes to oxidize the AlGaAs series thin film.

7. A method in accordance with claim 1 wherein:
the hetero-compound cap layer is GaAs and is oxidized into amorphous $Al_2O_3$.

8. A method in accordance with claim 1 wherein:
the hetero-compound cap layer is GaAs and only a top portion of the cap layer is oxidized.

* * * * *